United States Patent
Rifani et al.

(10) Patent No.: US 11,251,171 B2
(45) Date of Patent: Feb. 15, 2022

(54) REMOVABLE INTERPOSER

(71) Applicant: Intel Corporation, Santa Clara, CA (US)

(72) Inventors: Michael Rifani, Beaverton, OR (US); Robert J. Munoz, Round Rock, TX (US); Thomas P. Thomas, Portland, OR (US); John Mark Matson, Portland, OR (US); Kursad Kiziloglu, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 736 days.

(21) Appl. No.: 16/007,867

(22) Filed: Jun. 13, 2018

(65) Prior Publication Data

US 2019/0385994 A1 Dec. 19, 2019

(51) Int. Cl.

| | |
|---|---|
| *H01L 25/18* | (2006.01) |
| *H01L 23/32* | (2006.01) |
| *G02B 6/12* | (2006.01) |
| *H01L 23/538* | (2006.01) |

(52) U.S. Cl.
CPC .......... *H01L 25/18* (2013.01); *G02B 6/12002* (2013.01); *H01L 23/32* (2013.01); *H01L 23/5385* (2013.01); *H01L 23/5386* (2013.01)

(58) Field of Classification Search
CPC ..... H01L 25/18; H01L 23/32; H01L 23/5385; G02B 6/12002
See application file for complete search history.

(56) References Cited

U.S. PATENT DOCUMENTS

| 4,788,767 | A | * | 12/1988 | Desai | H05K 3/363 |
| | | | | | 29/830 |
| 5,159,535 | A | * | 10/1992 | Desai | H01L 23/4985 |
| | | | | | 257/E21.705 |
| 5,170,931 | A | * | 12/1992 | Desai | H01L 23/4985 |
| | | | | | 228/180.22 |
| 5,321,583 | A | * | 6/1994 | McMahon | H01R 13/2414 |
| | | | | | 174/255 |
| 5,974,662 | A | * | 11/1999 | Eldridge | H01L 23/49811 |
| | | | | | 29/842 |
| 6,029,344 | A | * | 2/2000 | Khandros | B23K 20/004 |
| | | | | | 29/874 |
| 6,246,247 | B1 | * | 6/2001 | Eldridge | H05K 3/3426 |
| | | | | | 257/E21.507 |
| 6,255,833 | B1 | * | 7/2001 | Akram | G01R 1/0483 |
| | | | | | 324/756.02 |
| 6,294,731 | B1 | * | 9/2001 | Lu | H01L 23/433 |
| | | | | | 174/388 |
| 6,615,485 | B2 | * | 9/2003 | Eldridge | H01L 21/4853 |
| | | | | | 29/843 |
| 7,086,149 | B2 | * | 8/2006 | Eldridge | H01L 24/72 |
| | | | | | 29/876 |

(Continued)

*Primary Examiner* — Peter Radkowski
(74) *Attorney, Agent, or Firm* — Patent Capital Group

(57) ABSTRACT

Embodiments may relate to a substrate for use in a system in package (SIP). The substrate may include a first couple to couple with a first component via a permanent couple such that the first component is communicatively coupled with a bridge. The substrate may further include a second couple to removably couple with an interposer such that the interposer is communicatively coupled with the bridge via a communicative couple. Other embodiments may be described or claimed.

25 Claims, 9 Drawing Sheets

(56) References Cited

U.S. PATENT DOCUMENTS

| | | | |
|---|---|---|---|
| 8,008,764 B2* | 8/2011 | Joseph | H01L 25/0657 |
| | | | 257/686 |
| 8,198,576 B2* | 6/2012 | Kennedy | G01S 7/4863 |
| | | | 250/210 |
| 8,373,428 B2* | 2/2013 | Eldridge | B23K 20/004 |
| | | | 324/754.14 |
| 9,257,834 B1* | 2/2016 | Moghe | H02H 7/205 |
| 9,275,955 B2* | 3/2016 | Mahajan | H01L 25/50 |
| 9,640,521 B2* | 5/2017 | Chang | H01L 22/14 |
| 9,716,067 B2* | 7/2017 | Mahajan | H01L 25/50 |
| 9,979,469 B2* | 5/2018 | Butler | G02B 6/3882 |
| 10,068,852 B2* | 9/2018 | Mahajan | H01L 25/0657 |
| 2011/0312129 A1* | 12/2011 | Joseph | H01L 23/49833 |
| | | | 438/107 |
| 2015/0171015 A1* | 6/2015 | Mahajan | H01L 21/568 |
| | | | 257/712 |
| 2016/0093597 A1* | 3/2016 | Chang | H01L 24/14 |
| | | | 257/737 |
| 2016/0155705 A1* | 6/2016 | Mahajan | H01L 23/3675 |
| | | | 438/107 |
| 2016/0170148 A1* | 6/2016 | Butler | G02B 6/4292 |
| | | | 385/89 |
| 2016/0343666 A1* | 11/2016 | Deshpande | H01L 25/0655 |
| 2017/0236724 A1* | 8/2017 | Chang | H01L 24/82 |
| | | | 438/15 |
| 2017/0301625 A1* | 10/2017 | Mahajan | H01L 24/73 |

* cited by examiner

REMOVABLE INTERPOSER

FIELD

Embodiments of the present disclosure generally relate to the field of semiconductor packages.

BACKGROUND

The microelectronic industry routinely integrates multiple microchips, typically from different technologies and manufacturers, into hierarchical packages. A system-level integration may enable highly compelling functions, but it may restrict modularity of maintenance by end-customer. The system-level integration may also complicate manufacturing yield of original equipment manufacturer (OEM) customers.

This tradeoff between functionality and modularity or manufacturing yield may also apply to combinations of a central processing unit (CPU) with a secondary chip in a package. Examples of such a system may include systems with field programmable gate arrays (FPGAs) memory such as high bandwidth memory (HBM) or three-dimensional crosspoint (3-D xpoint) memory, or other packages. For the sake of discussion herein, such packages may be referred to herein as CPU+ packages or systems.

In legacy systems, an end-customer operating a 10,000-node supercomputer that uses double data rate (DDR) memory may budget approximately $3 million a year to replace memory cards at approximately $50 apiece. Typically, a 16 Gigabyte (GByte) dynamic random access memory (DRAM) device may operate 8 64 bit channels at 2.133 Gigabits per second (Gbit/s) for a total bandwidth of approximately one Terabit per second (Tbit/s).

However, to satisfy an increasing demand for memory, the server industry may view HBM as the next memory hierarchy of choice behind DRAM. Generation 3 HBM input/output (HBMIO) is projected to operate 8 64-bit channels at 2.4 Gbit/s for a total memory bandwidth of approximately 2.5 Tbit/s.

DETAILED DESCRIPTION

Figure 1:
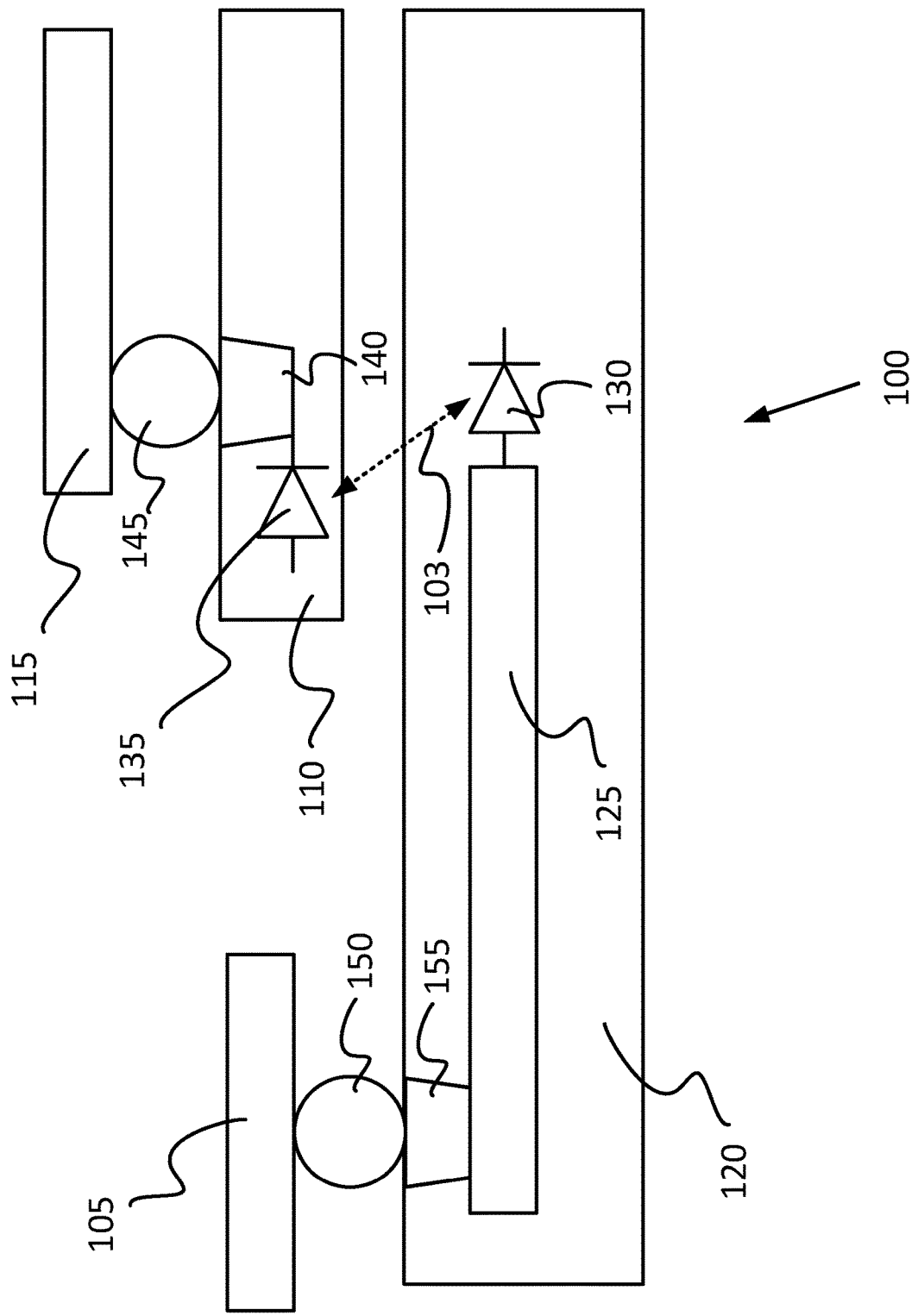
FIG. 1 illustrates an example package with a removable interposer, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

In legacy packages, HBM memory dies may be soldered to the same package that contains the CPU. Thus, replacing a memory die means replacing the CPU together with it. Also, while each HBM device is already more expensive than a DDR part of the same capacity, an HBM memory sub-system may typically combine eight devices, thereby increasing the price tag of the memory sub-system. From an end-customers' viewpoint, the maintenance cost of such a system may become 10× more rigid than legacy systems that use DDR technology.

Embodiments herein may relate to this end-customers' pain point. Specifically, embodiments herein may relate to a system-on-package that may be physically modular while still retaining an integrated functionality. Specifically, in some embodiments memory such as HBM memory may be made detachable, and thus replaceable independently of the CPU.

Generally, legacy CPU+ designs may suffer from manufacturing yield problems after packaging assembly. Legacy solutions to these manufacturing yield problems may be constrained by the fact that CPU+ components are typically held together by soldered interconnects, and thus are not easily physically separable.

In one example of a memory sub-system, legacy solutions may deal with memory failures depending on the type of the failures. A hard failure may be addressed using redundancy to replace a portion of the memory suffering from such a failure. A soft error failure may be detectable and correctable using single-bit error-correction. Embodiments herein may assist with resolving hard failures while also allowing for legacy techniques to address soft error failures.

Generally, legacy packages by themselves may not address the projected 10× increase in the rigidity of part-replacement policy that may burden end-customers. Additionally, legacy packages may not address the convoluted nature of package-level manufacturing throughput. By contrast, embodiments herein may work in combination with legacy solutions to improve the overall strategy against failures in a CPU+ system.

Embodiments herein may address the rising cost of memory part-replacement in servers, as discussed above. Generally, in embodiments, HBM memory or some other component of a CPU+ system may be made detachable, and thus replaceable independently of the CPU. FIG. 1 illustrates an example package 100 with a removable interposer 110, in accordance with various embodiments. Specifically, the package may include a processor 105 which may be, for example, a CPU, a processor that may include one or more cores, a plurality of processors, a microprocessor, etc.

The processor 105 may be coupled with a substrate 120. In embodiments, the substrate 120 may be a cored substrate, a coreless substrate, or some other type of substrate. Generally, the substrate 120 may include one or more layers, traces, pads, vias, etc. which are not shown in FIG. 1 for the sake of clarity. In some embodiments the substrate 120 may include one or more components positioned within the substrate or externally permanently coupled or removably coupled with the substrate, which are again not shown in FIG. 1 for the sake of clarity. The substrate may be formed of, for example, one or more layers of an ajimoto build-up film (ABF), an epoxy, a polymer, or some other material.

In some embodiments, the substrate 120 may include a bridge 125. The bridge may be, for example, an active silicon (Si) bridge. A bridge may refer to an element that is able to convey electrical signals. In some embodiments, an active Si bridge may have one or more transistors positioned therein that are able to convey the electrical signals. In other embodiments, the bridge 125 may be an embedded multi-die interconnect bridge (EMIB) which may be a bridge die with multiple routing layers imbedded within the substrate 120. Additionally, or alternatively, the bridge 125 may be some other type of bridge able to convey electrical signals between two points.

The package 100 may further include a memory 115. As discussed above, the memory 115 may be an HBM memory. However, in other embodiments the memory 115 may be some other type of memory such as a DDR memory, a 3-D xpoint memory, a type of random access memory (RAM) such as a DRAM, or some other type of memory. Additionally, although memory will be described herein with respect to various packages, in other embodiments a different type of component such as a fPGA, another processor, or some other type of component may be used in the CPU+ system instead of a memory. In other words, the term "memory" as used herein is used as one example but is not intended to strictly limit applications of ideas or embodiments herein to only memory.

The package 100 may further include an interposer 110 generally positioned between the memory 115 and the substrate 120. The interposer 110 may be formed of a material similar to that of the substrate 120. For example, the interposer 110 may be cored or coreless, and may be formed of, for example, one or more layers of an ABF, an epoxy, a polymer, or some other material. The interposer 110 may have one or more components, vias, layers, traces, or pads therein or thereon. The interposer 110 is shown as separate from the substrate 120 because the interposer 110 may be removably coupled with the substrate 120. For example, as described in greater detail later with respect to FIG. 7, the interposer 110 may be held to the substrate 120 via one or more clamps. Additionally, or alternatively, the interposer 110 may be coupled with the substrate 120 via an adhesive, a socket, or via a fastener such as a screw, a bolt, etc. More generally, the interposer 110 may be coupled with the substrate 120 in such a manner that the interposer 110 may be removed from the substrate in such a manner that the removal process will not cause damage such as warping, cracking, etc. so components of the package 100 such as the processor 105, the substrate 120, the memory 115, or some other component of the package 100. Such a coupling where damage may occur as a result of removing the interposer 110 from the substrate 120 may be referred to herein as a "permanent" couple. A coupling where damage may be avoided when the interposer 110 is removed from the substrate 120 (i.e., a coupling that includes a clamp, an adhesive, a fastener, etc.) may be referred to as a "non-permanent" or "removable" couple.

In some embodiments, the processor 105 may be coupled with the substrate 120 via a solder joint. As discussed herein, solder joints may be referred to as "microbumps" and such a solder joint may be microbump 150. However, it will be understood that other types of solder joints may be used in other embodiments.

The solder microbump 150 may, in turn, be coupled with a via 155. The via 155 may be a plated or un-plated via, a through-hole via, or some other type of via. In embodiments, a pad may be positioned between the microbump 150 and the via 155, or between the microbump 150 and the processor 105. These pads are not shown herein for the sake of clarity of the figure. The via 155 may in turn be coupled with the bridge 125. Such a coupling may allow for electrical, optical, thermal, or some other type of communication between the processor 105 and the bridge 125. Additionally, as noted above, the coupling of the processor 105 to an element of the substrate 120 such as the via 155 by way of the solder microbump 150 may be referred to as a "permanent" coupling. In embodiments, such a coupling may be undone, for example by a solder reflow process, but doing so may harm one or more elements of the package 100 such as the processor 105, the memory 115, the substrate 120, or some other element of the package 100. Such harm may include, for example, cracking, warping, delamination, etc.

The memory 115 may further be coupled with the interposer 110, and particularly a via 140 of the interposer 110, via a solder microbump 145. The solder microbump 145 and the via 140 may be respectively similar to solder microbump 150 and via 155. As described above, a pad may be positioned between the memory 115 and the solder microbump 145, or between the solder microbump 145 and the via 140.

The substrate 120 and interposer 110 may further include an optical link such as optical transceivers 130 and 135, respectively. More generally the optical transceivers 130 and 135 may include both an optical transmitter such as a light emitting diode (LED), and an optical receiver. Such an optical transceiver may be referred to as a light emitting and absorbing diode (LEAD). Generally, optical transceiver 135 may be communicatively coupled with via 140, and optical transceiver 130 may be coupled with bridge 125. In embodiments, one or more elements or components may be positioned between the optical transceiver 135 and the via 140, or between the optical transceiver 130 and the bridge 125, which are not shown herein for the sake of clarity. The optical transceivers 130 or 135 may also be coupled with one or more additional components or elements such as power sources, transistors, capacitors, etc.

The optical transceivers 130 and 135 may be able to convey an optical signal 103 between one another. Specifically, the interposer 110 may be removably coupled to the substrate 120 such that optical transceivers 135 and 130 are aligned. When optical transceiver 130 generates a light pulse that contains information, optical transceiver 135 may be able to receive the light pulse. Conversely, optical transceiver 135 may be able to generate a light pulse that transmits information to optical transceiver 130.

It will be understood that the configuration of the package 100 may allow for information transferal between the processor 105 and the memory 115. For example, processor 105 may generate one or more data signals such as an electrical signal or some other type of signal. The signal may travel from processor 105 through the solder microbump 150 and via 155 to the bridge 125. The signal may then transfer from the bridge 125 to the optical transceiver 130 where it may be transformed into an information-containing optical signal 130 that is then transmitted from optical transceiver 130 to optical transceiver 135, where optical transceiver 135 may transform the optical signal back to an information-containing electrical signal. The electrical signal may then be transmitted from optical transceiver 135 through the via 140 and solder bump 145 to the memory 115. Information may similarly be transmitted from memory 115 to processor 105 in a reverse manner.

As noted above, the embodiment of the package 100 of FIG. 1 may provide benefits over legacy solutions. Specifically, embodiments may provide a relatively inexpensive interposer 110 with optical signaling capability. The interposer 110 may facilitate signaling between the processor 105 and the memory 115 without requiring that the memory 115 be soldered to the substrate 120. By allowing the interposer 110 to be removable, customers may be able to replace or upgrade the memory 115 independently of the processor 105, thereby saving the financial/manufacturing/labor costs that could be associated with replacing the relatively expensive processor 105.

Furthermore, a detachable memory 115 and interposer 110 may serve to divide-and-conquer manufacturing challenges of the package 100. Server manufacturers may benefit from a simpler throughput equation, instead of a combined calculation with complex dependencies on multiple components and companies delivering those components.

It will be understood that the embodiment of FIG. 1, and other Figures herein, is intended as one example. For example, in some embodiments the vias 155 or 140 may only be partial vias that go to another layer of the interposer 110 or substrate 120, and then are communicatively coupled with additional partial vias that complete the signal path. Similarly, the package 100 may include additional solder microbumps, additional layers or components, etc.

Figure 2:
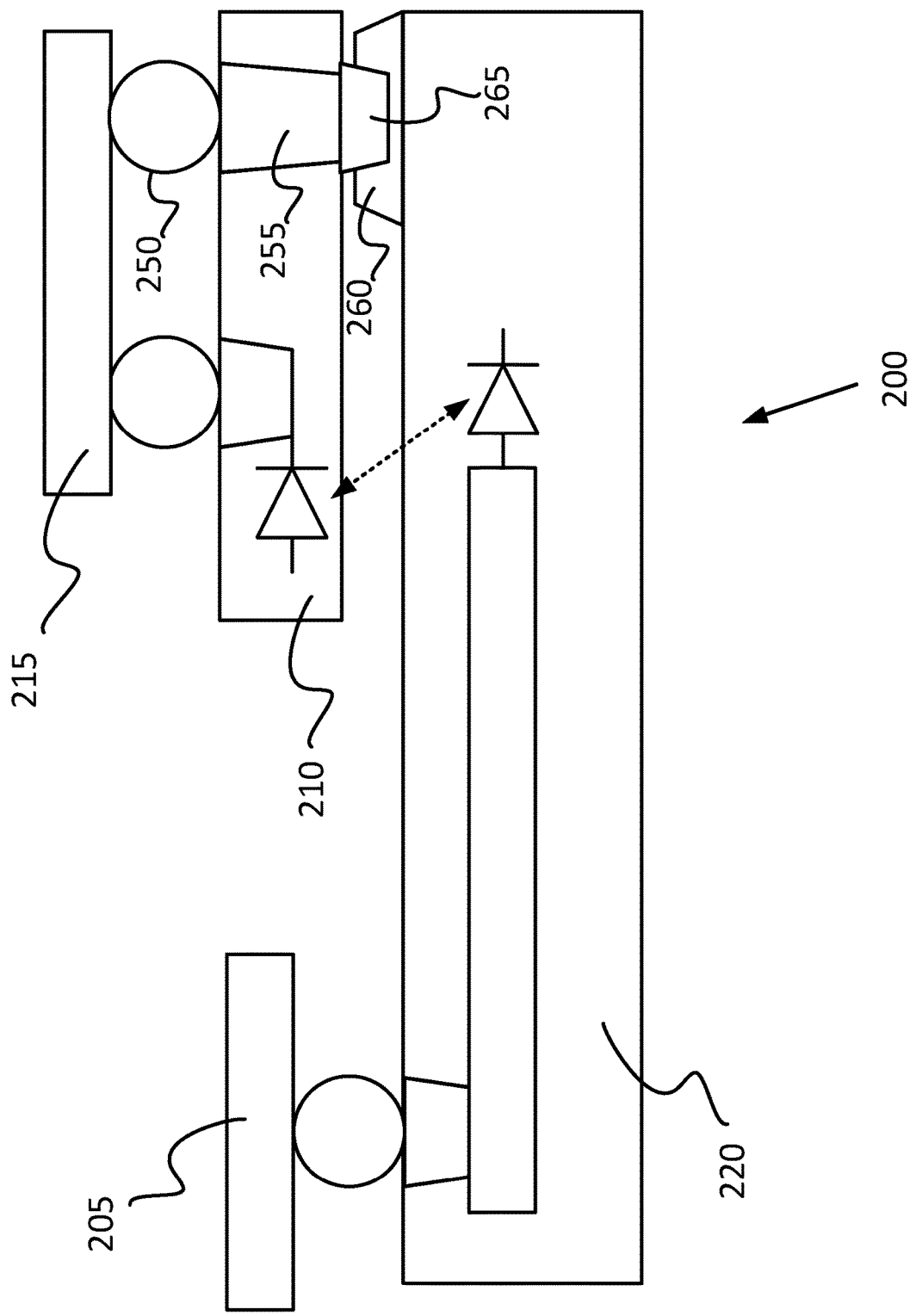
FIG. 2 illustrates an alternative example package with a removable interposer, in accordance with various embodiments.

In some embodiments, it may be desirable for power delivery throughout the hierarchical package assembly to be detachable. It may, for example, be desirable for power connectivity to the interposer to support on the order of 12 watts (W) of power consumption. FIG. 2 depicts an example package 200 that may assist with such power delivery. Specifically, FIG. 2 depicts a package 200 that may include a processor 205, an interposer 210, a memory 215, and a substrate 220, which may be respectively similar to processor 105, interposer 110, memory 115, and substrate 120. The package 200 may include additional elements that may be similar to those of package 100, but which are not specifically enumerated for the sake of clarity and efficiency.

In embodiments, the package 200 may further include a power supply receptacle 260 coupled with the substrate 220. As shown in FIG. 2, the receptacle 260 may be positioned on an outer surface of the substrate, however in other embodiments the receptacle 260 may be positioned at least partially within the substrate 220.

The interposer 210 may include a power supply bump 265 coupled with an outer surface of the interposer 210, and which may be configured to removably mate with the receptacle 260. The power supply bump 265 may be coupled with a via 255 which may go through the interposer 210 and couple with a solder microbump 250 which may be similar to solder microbumps 145 or 150. The solder microbump 250 may then be communicatively coupled with the memory 215. Generally, the power supply bump 265 and the receptacle 260 may be considered to be a power couple that includes a non-permanent connection between the interposer 210 and the substrate 220.

As shown, the receptacle 265 may be configured to provide power to the power supply bump 265 when the power supply bump 265 is removably mated with the receptacle 260 as shown. The power may then travel from the power supply bump 265, through the via 255 to the microbump 250 and into the memory 215, thereby providing power for the memory 215.

It will be understood that the embodiment shown in FIG. 2 is intended as an example, and alternatives may be envisioned. For example, as mentioned the receptacle 260 may be at least partially within the substrate 220. In other embodiments, the power supply bump 265 may be coupled with the substrate 220, and the receptacle 260 may be coupled with the interposer 210. In some embodiments, the via 255 may be implemented as one or more vias at different layers of the interposer, communicatively coupled with one another by one or more traces within the interposer 210. As described above with respect to package 100, in some embodiments a pad may be positioned between the memory 215 and the microbump 250, or the microbump 250 and the via 255. Similarly, in some embodiments a pad may be positioned between the via 255 and the power supply bump 265.

Figure 3:
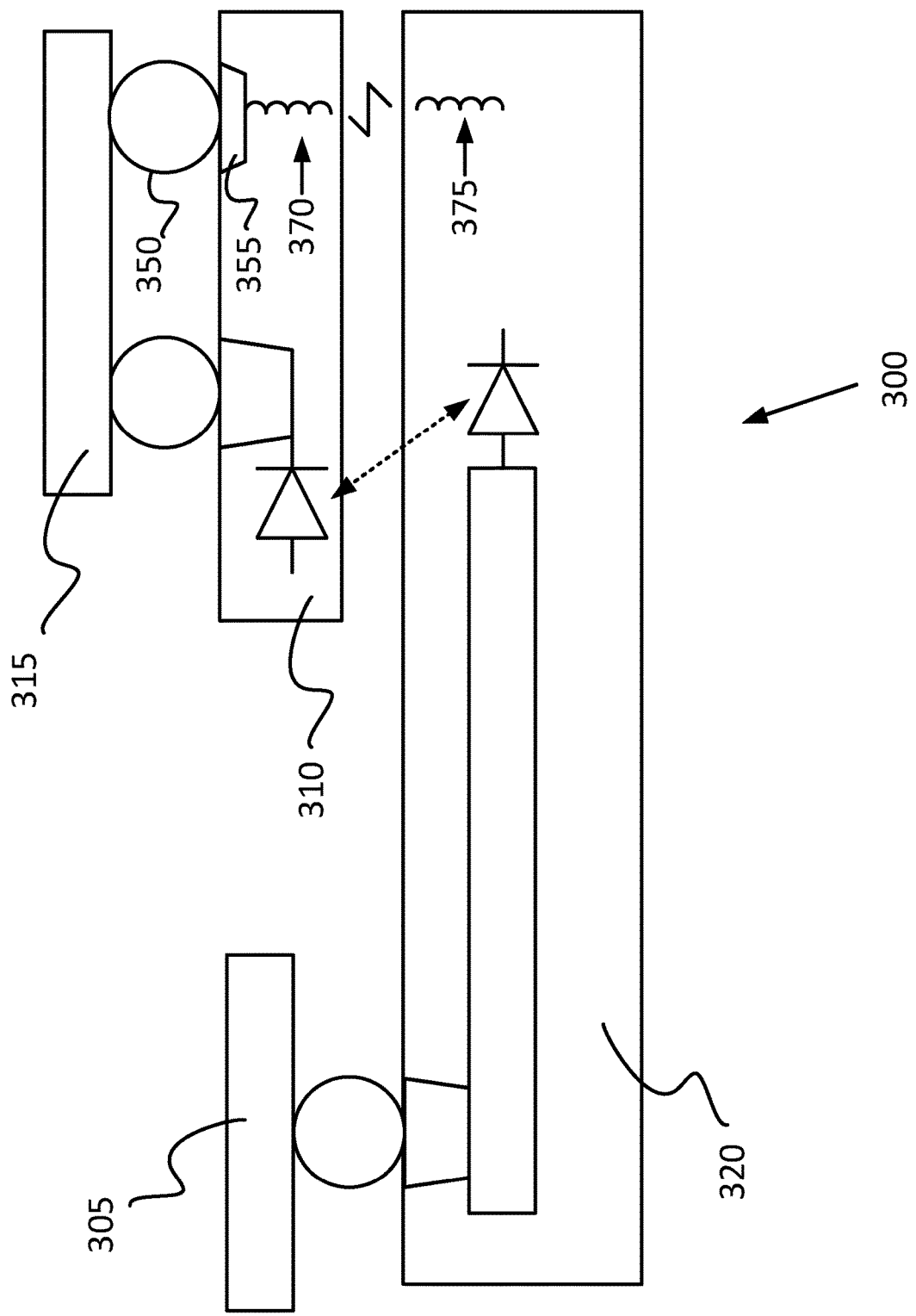
FIG. 3 illustrates an alternative example package with a removable interposer, in accordance with various embodiments.

For an entirely contact-less assembly, that is, an assembly where the interposer may not be in physical contact with the substrate or an assembly where it would be undesirable to have solder pads or microbumps, it may be possible to bring power at high alternating current (AC) voltage and lower current with an inductive or transformer-based coupling from the interposer. FIG. 3 depicts an example of an inductive-power based package 300. Specifically, the package 300 that may include a processor 305, an interposer 310, a memory 315, and a substrate 320, which may be respectively similar to processor 105, interposer 110, memory 115, and substrate 120. The package 300 may include additional elements that may be similar to those of package 100, but which are not specifically enumerated for the sake of clarity and efficiency. The package 300 may further include a microbump 350 which may be similar to microbump 250 of package 200.

In some embodiments, the package 300 may further include two inductors 370 and 375. The inductors 370 and 375 may be considered to be a power couple operable to provide power to the interposer 310 or, more specifically, the memory 315. Specifically, one inductor 375 may be present in the substrate 320, and another inductor 370 may be present in the interposer 310. Inductor 375 may be referred to as a "primary" or "source" inductor, and inductor 370 may be referred to as a receiving inductor 370.

In some embodiments, inductor 375 may be coupled with a power source (not shown) which may be internal or external to the substrate 320 and configured to provide AC voltage through inductor 375. The AC voltage through inductor 375 may set up a resonant AC voltage through inductor 370. Inductor 370 may be coupled with a pad 355 (which may be, for example, copper, gold, or some other conductive material) which may in turn be coupled with microbump 350. The current generated in inductor 370 may in turn be transmitted through the pad 355 and the microbump 350 to memory 315, thereby providing power to the memory 315.

The inductive coupling between inductors 370 and 375 may eliminate power connects such as the receptacle 260 and the power supply bump 265 depicted in FIG. 2. Additionally, the voltage may be reduced for the memory 315 based on the ratio of turns of the inductors. Specifically, in some embodiments it may be desirable for inductor 375 to have more turns than inductor 370. The low voltage AC provided by inductor 370 may then be rectified to multiple direct current (DC) voltage domains on the memory 315 using integrated voltage regulators at high efficiency. It will be noted that some embodiments discussed herein may have heat-sinks or other cooling solutions, and it may be desirable to ensure that use of the inductors 370 or 375 does not interfere with the cooling or heat-sinks of the packages such as package 300. It will be noted that the embodiment depicted in FIG. 3 is intended as one example, and other embodiments may have additional inductors, or inductors in different positions.

Figure 4:
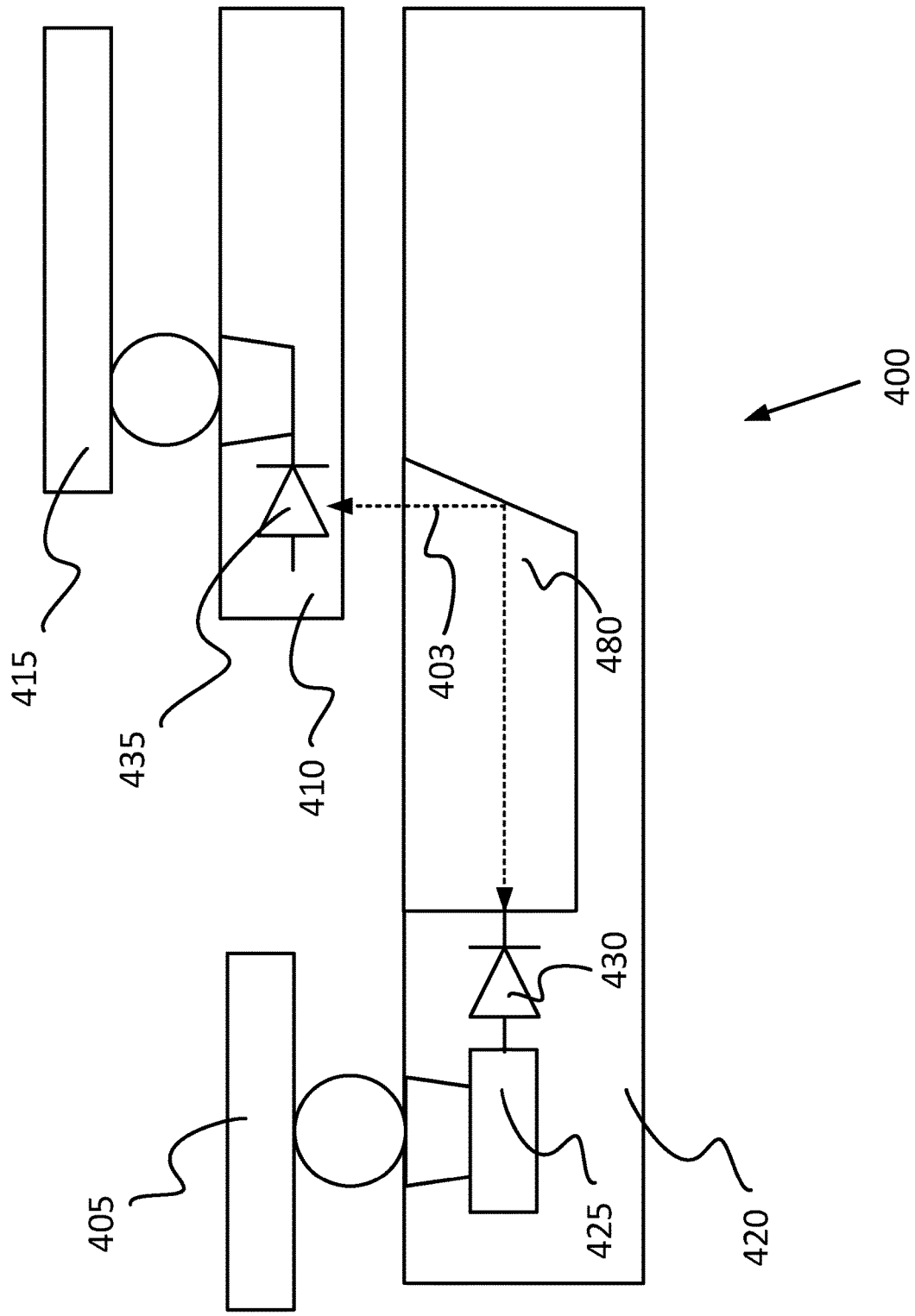
FIG. 4 illustrates an alternative example package with a removable interposer, in accordance with various embodiments.

In another embodiment, a package may include an electro-optical conversion near the processor, thus a signal traveling through the substrate to the interposer is mostly optical rather than electrical. FIG. 4 depicts such an embodiment.

Specifically, FIG. 4 depicts a package 400 that may include a processor 405, an interposer 410, a memory 415, and a substrate 420, which may be respectively similar to processor 105, interposer 110, memory 115, and substrate 120. The package 400 may include additional elements that may be similar to those of package 100, but which are not specifically enumerated for the sake of clarity and efficiency.

In embodiments, the package 400 may include a bridge 425, which may be similar to bridge 125. Specifically, bridge 125 may be an active Si bridge. In embodiments, the substrate 420 may further include a waveguide 480. In embodiments the waveguide 480 may be, for example, a silicon waveguide 480 or some other waveguide that allows for optical signal propagation through the substrate 420. The waveguide 480 may be coupled with optical transceiver 430, which may be similar to optical transceiver 130. By using the waveguide 480, the optical signal 403 (which may be similar to optical signal 103) may be transmitted between optical transceiver 430 and optical transceiver 435. As can be seen in FIG. 4, the waveguide 480 may have a reflective surface to change the direction of the optical signal 403. In this embodiment, the optical transceivers 430 and 435, and the waveguide 480, may be considered to form the optical link between the substrate 420 and the interposer 410.

It will be understood that the waveguide 480 is not depicted at scale, and in some embodiments may be shaped differently or positioned at a different portion of the substrate 420. Additionally, or alternatively, the interposer 410 may also include a waveguide similar to waveguide 480. By investing in optical waveguides on the substrate 420, an opportunity may be provided to observe the optical signal 403, which may have been impractical in legacy CPU+ systems. The optical property of the routing may, in some embodiments, be designed to divert a small portion of the optical signal 403 for diagnostic purposes. More transparency at system-level debug facilitated by this embodiment may provide an advantage for OEM customers who wish to improve their manufacturing throughput.

Figure 5:
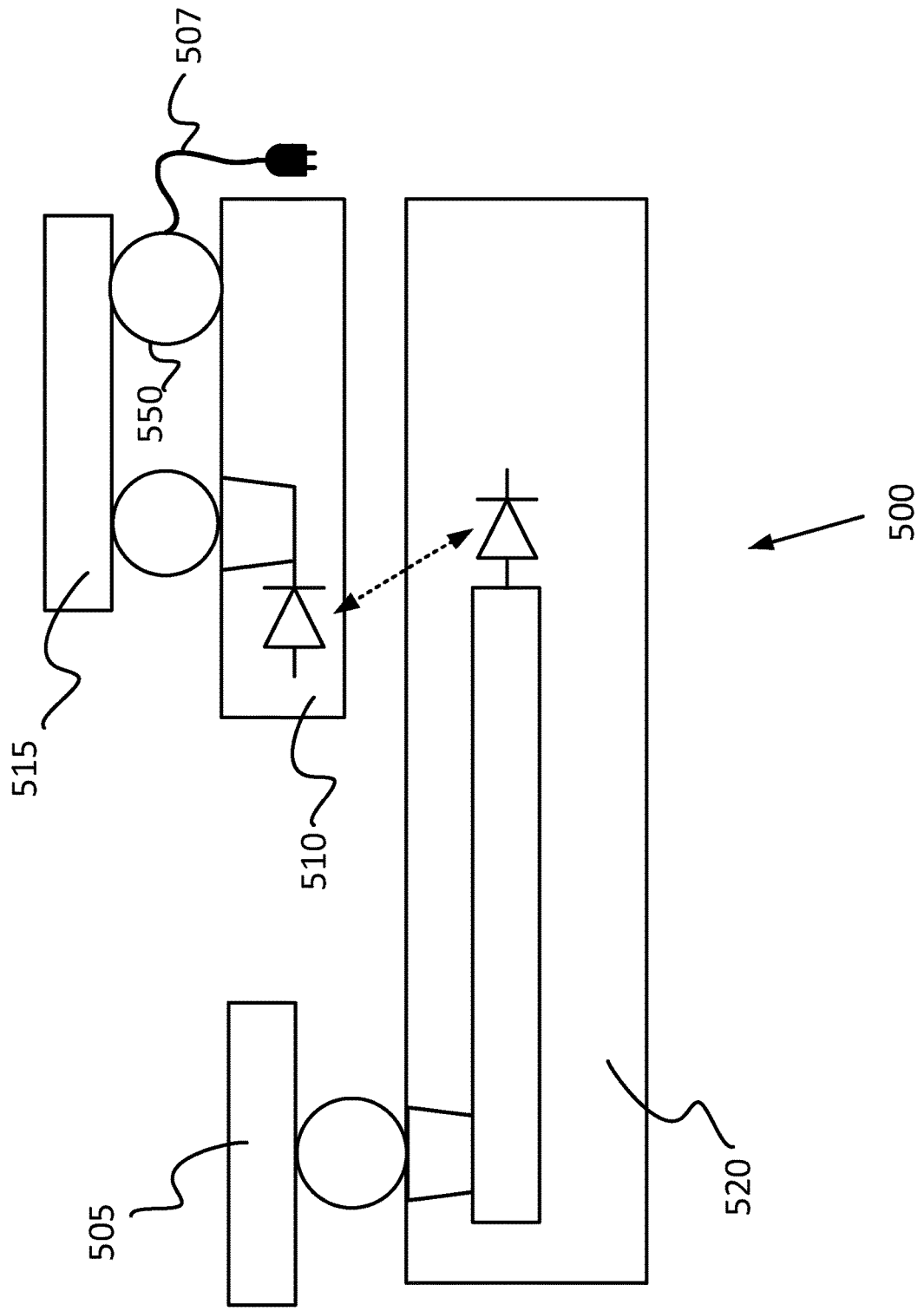
FIG. 5 illustrates an alternative example package with a removable interposer, in accordance with various embodiments.

FIG. 5 depicts an alternative embodiment to provide power to the memory. Specifically, FIG. 5 depicts a package 500 that may include a processor 505, an interposer 510, a memory 515, and a substrate 520, which may be respectively similar to processor 105, interposer 110, memory 115, and substrate 120. The package 500 may include additional elements that may be similar to those of package 100, but which are not specifically enumerated for the sake of clarity and efficiency. The package 500 may further include a microbump 550, which may be similar to microbump 250 of FIG. 2.

As can be seen in FIG. 5, the package 500 may further include a power connector 507 coupled with the package 500. As shown in FIG. 5, the power connector 507 may be coupled with the microbump 550 to provide power to the memory 515 via the microbump 550. However, in other embodiments, the power connector 507 may be coupled directly with the memory 515, or physically coupled with the interposer 510 and configured to provide power through the microbump 550 to the memory 515. For example, the power connector 507 may be electrically coupled with the microbump 550 through one or more traces or vias of the interposer 510.

In FIG. 5, the power connector 507 is shown as a traditional 2-prong plug-type connector. However, in other embodiments the power connector 507 may have a different shape or form. For example, in some embodiments the power connector 507 may be a universal serial bus (USB) connector, a peripheral component interconnect express (PCIe) connector, a serial advanced technology attachment (SATA) connector or some other type of connector.

Figure 6:
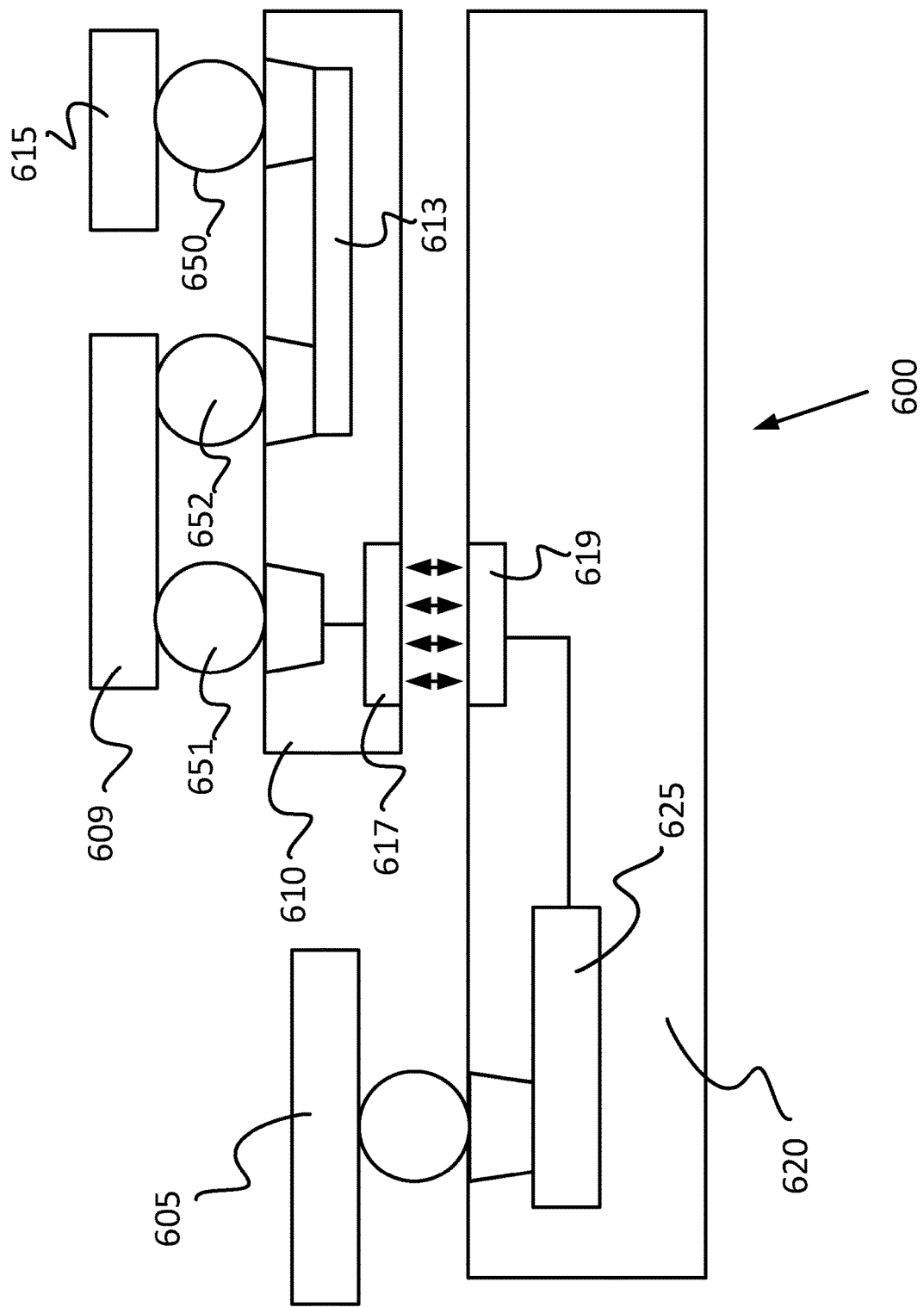
FIG. 6 illustrates an alternative example package with a removable interposer, in accordance with various embodiments.

In some embodiments, it may be desirable to use a different type of component to communicate between the interposer and the substrate. FIG. 6 depicts an example of a package 600 that is based on capacitive communication rather than optical communication. Specifically, FIG. 6 depicts a package 600 that may include a processor 605, an interposer 610, a memory 615, a substrate 620, and a bridge 625, which may be respectively similar to processor 105, interposer 110, memory 115, substrate 120, and bridge 125. The package 600 may include additional elements that may be similar to those of package 100, but which are not specifically enumerated for the sake of clarity and efficiency. The package 500 may further include microbumps 650, 651, and 652, which may be similar to microbump 250 of FIG. 2.

The package 600 may further include a metal-insulator-metal (MIM) capacitor that includes a plate 617 in the interposer 610 and a plate 619 in the substrate 620. The plates 617 and 619 may be formed of, for example copper, aluminum, alloys thereof, or some other MIM capacitor material. The MIM capacitor may be formed of an insulator between the two plates 617 and 619. The insulator may be, for example, the space between the two plates 617 and 619, or there may be a further dielectric insulator such as a laminate layer, a polymer layer, an epoxy layer, or some other insulator on one or both of the plates 617 and 619.

As can be seen, the plate 619 may be communicatively coupled with bridge 625. It will be understood that the depicted coupling is for illustration purposes and the actual layout of plate 619 and bridge 625 may vary in different embodiments. When the bridge 625 provides an electrical signal, for example an electrical signal received from the processor 605, the electrical signal may be provided by the bridge 625 to plate 619. Plate 619 may transfer the signal to plate 617, for example via capacitive coupling, inductive coupling, thermal energy transfer, or some other type of radiative transfer. The signal in plate 617 may travel through microbump 651 to an AC/DC converter 609 where it may be changed from an AC type signal to a DC type signal. The DC type signal may then be transferred through microbump 652 to bridge 613, which may be similar to bridge 625, where it may then be transferred through microbump 650 to memory 615. Conversely, a signal may be transmitted from the memory 615 to the processor 605 via the reverse path. As noted above, it will be understood that the embodiment of FIG. 6 is intended as an example. Other embodiments may have a different number or configuration of the described elements.

As noted with respect to the earlier-described embodiments, the number or configuration of various of the elements may differ in different embodiments. For example, the number of bridges, the number of optical transceivers, etc. shown in the various embodiments may differ. Generally, various embodiments may include what may be considered to be a communicative couple or, more particularly, a non-permanent communicative couple. The non-permanent communicative couple may include, for example, an optical link such as the optical link that includes optical transceivers 130/135 or similar structures in FIGS. 2, 3, 5, etc. In some embodiments the optical link may include optical transceivers 430/435 and waveguide 480, as described above. In other embodiments, the non-permanent communicative couple may include, for example, the MIM capacitor depicted in FIG. 6. Other embodiments may have other non-permanent communicative couples wherein information may be transmitted between the substrate and the interposer without requiring a permanent coupling between the interposer and the substrate.

Figure 7:
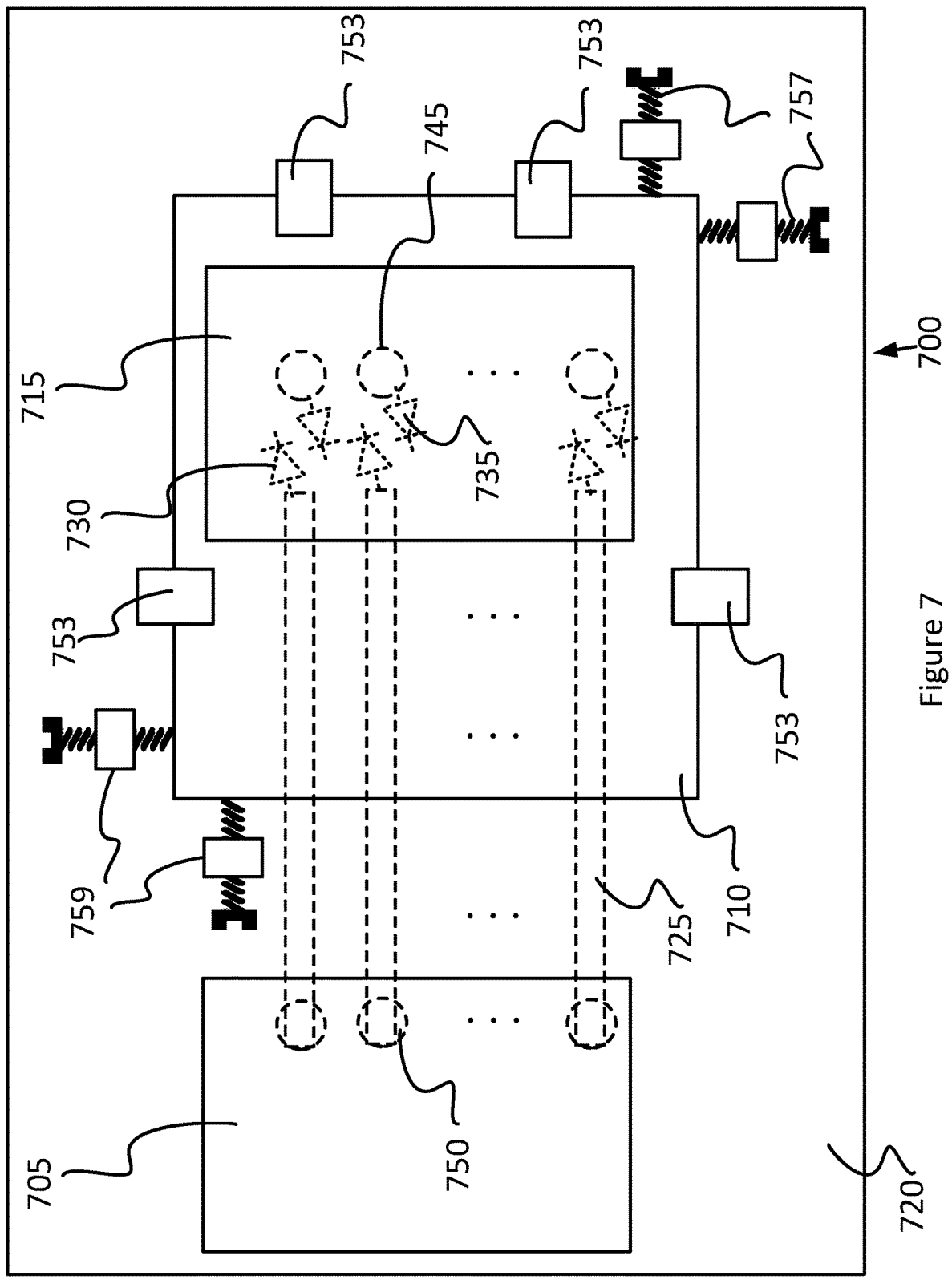
FIG. 7 illustrates an alternative examples top-down view of a package with a removable interposer, in accordance with various embodiments.

FIG. 7 depicts an example simplified top-down view of a package 700. The package 700 may include a plurality of elements as described above. Specifically, the package 700 may include a processor 705, an interposer 710, a memory 715, and a substrate 720, which may be respectively similar to processor 105, interposer 110, memory 115, and substrate 120. The package 700 may further include one or more additional elements as will be described in further detail below. It will be understood that FIG. 7 may depict a plurality of elements (for example the optical transceivers, bridges, microbumps, etc.) but only a single one of the elements may be specifically enumerated for the sake of clarity. Additionally, it will be understood that elements that are dashed may be positioned underneath other elements, as may be understood with reference to, for example, FIG. 1.

Package 700 may further include a plurality of bridges 725 that may be similar to bridge 125. Respective bridges 725 may be coupled on one end to a microbump 750, which may be similar to microbump 150, and on the other end to an optical transceiver 730, which may be similar to optical transceiver 130. Respective ones of the optical transceivers 730 may be optically coupled with an optical transceiver 735, which may be similar to optical transceiver 135. Respective optical transceivers 735 may be coupled with a microbump 745, which may be similar to microbump 145 and which may in turn be coupled with memory 715.

It will be understood that the various optical transceivers 730 and 735 are illustrated in FIG. 7 as offset for ease of illustration. However, in some embodiments the optical transceivers 730 and 735 may be aligned vertically (for example, as shown in FIG. 1), or may have some other configuration that allows them to optically communicate with one another.

In some embodiments, the package 700 may include one or more clamps 753. The clamps may, for example, be positioned along the top of the interposer 710, and also coupled with the substrate 720. The clamps 753 may be removable and may serve to hold the interposer 710 against the substrate 720. Although four clamps 753 are depicted, other embodiments may have more or fewer clamps 753. In some embodiments, the clamps 753 may be angled or vertical with respect to the face of the substrate 720. In some embodiments, the clamps 753 may be rectangular as shown, while in other embodiments one or more of the clamps may have a different shape such as triangular, oblong, oval, rounded, etc.

In some embodiments, the package 700 may further include one or more screws 757. The screws may be mounted in one or more guides 759, which may be posts coupled with the substrate 720. In embodiments, the guides 759 may be mounted on top of the substrate, while in others the guides 759 may be at least partially embedded within the substrate. In embodiments, the guides 759 may have a rectangular cross section as shown in FIG. 7, while in other embodiments the guides 759 may have a differently shaped cross section.

In embodiments, the screws 757 may be inserted into the guides 759 and coupled with the interposer 710. The screws 757 may be fine pitch, for example having a pitch of between approximately 80 and approximately 100 turns per inch of the threaded screw. Rotation of the screws 757 may cause them to move laterally within the guides 759 and exert a force on the interposer 710. This force may cause the interposer 710 to shift laterally, that is up/down or left/right with respect to the view of FIG. 7. That lateral shift may allow the optical transceivers 730 to align with optical transceivers 735.

Generally, mechanical misalignments, for example of optical transceivers 730 and 735, during package integration by an OEM customer, or during a part-replacement by an end-customer, may be mitigated by this lateral shift. For example, the optical aperture of the optical transceivers 730 and 735 may be on the order of 20 micrometers ("microns" or "μm"). However, socket misalignments during part-replacement may be on the order of 50 microns. Adjustment using the screws 757 may allow the interposer 710 to be moved and positioned within an approximately ten micron accuracy, thereby allowing for alignment of the optical transceivers 730 and 735. Additionally, once the screws 757 are rotated to position the interposer 710, the screws 757 may be tightened to hold the interposer 710 in place. It will be understood that although only four screws 757 and four guides 759 are depicted in FIG. 7, other embodiments may have more or fewer screws 757 or guides 759. Additionally, in some embodiments the screws 757 or guides 759 may be positioned in a different configuration than that shown in FIG. 7. In some embodiments, the screws 757 may have a different "head" which may be used to rotate the screws 757. In some embodiments, the screws 757 may be coupled with the memory 715, or some other element of the package 700. Generally, the screws 757 may be generalized to a mechanical device that facilitates fine lateral movement of the interposer 710, and other embodiments may include different types of a mechanical device that allows for the same function.

Although the embodiment of the package 700 is illustrated based on optical transceivers such as optical transceivers 730 and 735, it will be understood that other embodiments may use an MIM capacitor such as that shown in FIG. 6, or some other way to communicate information from the substrate to a removable interposer. These embodiments may still use one or both of the clamps such as clamps 753 or the screws such as screws 757 to hold the interposer in place or to allow for fine movement of the interposer. Some embodiments may have the screw(s) and guide(s) without the clamp(s), while other embodiments may have the clamp(s) without the screw(s) and guide(s). Embodiments such as any of packages 100, 200, 300, 400, 500, or 600 may include the screws and guides or the clamps, or both. Similarly, package 700 may include aspects of any of packages 100, 200, 300, 400, 500, or 600 such as the power supply aspects of packages 200, 300, or 500, the waveguide of package 400, etc. Additionally, although embodiments are depicted as only having a single memory, a single interposer, or a single processor, some embodiments may have a plurality of memory chips, a plurality of interposers, or a plurality of processors.

Figure 8:
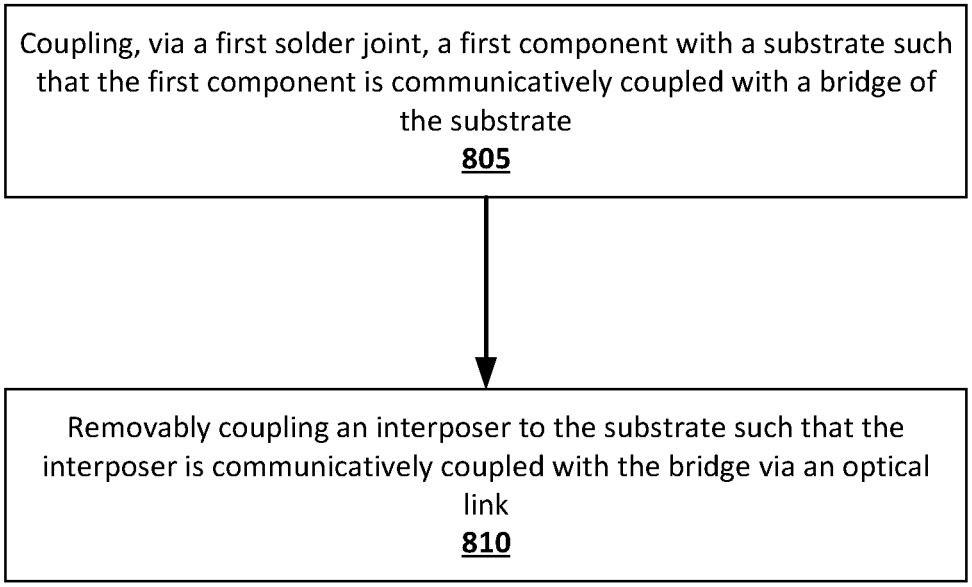
FIG. 8 illustrates an example process for making the package of any of FIGS. 1-7, in accordance with various embodiments.

FIG. 8 illustrates an example process for making the package of any of FIGS. 1-7, in accordance with various embodiments. At 805, a first component is coupled via a first solder joint with a substrate and communicatively coupled with a bridge of the substrate. At 810, an interposer is removably coupled to the substrate such that the interposer is communicatively couple with the bridge of the substrate via an optical link.

Figure 9:
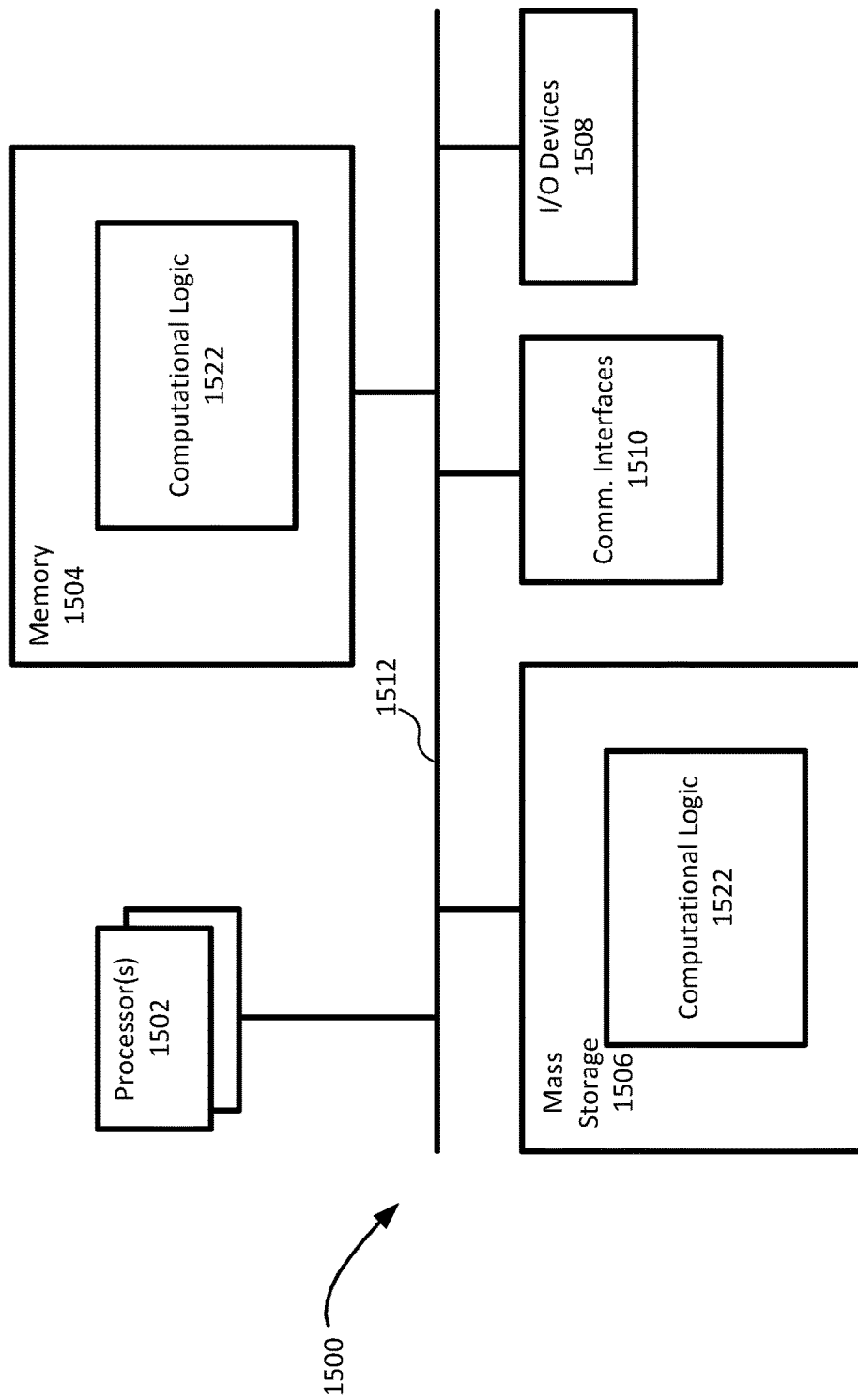
FIG. 9 illustrates an example device that may use the package of any of FIGS. 1-7, in accordance with various embodiments.

FIG. 9 illustrates an example computing device 1500 suitable for use with packages 100, 200, 300, 400, 500, 600, or 700 (collectively, "packages 100-700"), in accordance with various embodiments. Specifically, in some embodiments, the computing device 1500 may include one or more of packages 100-700 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of packages 100-700. For example, in some embodiments the processor 1502 may be processor 105, 205, 305, 405, 505, 605, or 705. Similarly, in some embodiments memory 1504 may be memory 115, 215, 315, 415, 515, 615, or 715.

EXAMPLES

Example 1 includes a system in package (SIP) comprising: a substrate with a bridge; a first component coupled with the substrate by a first solder joint, wherein the first component is communicatively coupled with the bridge; and a second component coupled with an interposer by a second solder joint, wherein the interposer is removably secured to the substrate and the interposer is communicatively coupled with the bridge by a non-permanent communicative couple.

Example 2 includes the SIP of example 1, wherein the first component is a processor.

Example 3 includes the SIP of example 1, wherein the second component is a memory.

Example 4 includes the SIP of example 1, wherein the bridge is an active silicon bridge.

Example 5 includes the SIP of example 1, wherein the bridge is an embedded multi-die interconnect bridge (EMIB).

Example 6 includes the SIP of any of examples 1-5, wherein the non-permanent communicative couple includes a metal-insulator-metal (MIM) capacitor.

Example 7 includes the SIP of any of examples 1-5, wherein the non-permanent communicative couple includes an optical link.

Example 8 includes the SIP of example 7, wherein the optical link includes a waveguide.

Example 9 includes the SIP of example 7, wherein the optical link includes a first optical transceiver coupled with the bridge and a second optical transceiver at the interposer.

Example 10 includes the SIP of any of examples 1-5, wherein the interposer further includes a power couple operable to provide power to the second component.

Example 11 includes the SIP of example 10, wherein the power couple is a non-permanent connection between the interposer and the substrate.

Example 12 includes the SIP of example 10, wherein the power couple includes a source inductor at the substrate and a receiving inductor at the interposer.

Example 13 includes the SIP of any of examples 1-5, wherein the interposer is removably secured to the substrate by a clamp.

Example 14 includes the SIP of any of examples 1-5, wherein the interposer is removably secured to the substrate by a socket.

Example 15 includes the SIP of any of examples 1-5, wherein the interposer is removably secured to the substrate by a fastener.

Example 16 includes a method of generating a system in package (SIP), the method comprising: coupling, via a first solder joint, a first component with a substrate such that the first component is communicatively coupled with a bridge of the substrate; and removably coupling an interposer to the substrate such that the interposer is communicatively coupled with the bridge via a communicative couple; wherein the interposer is coupled with a second component via a second solder joint and, when the interposer is removably coupled to the substrate, the second component is communicatively coupled with the first component via the interposer, the bridge, and the communicative couple.

Example 17 includes the method of example 16, wherein the first component is a processor.

Example 18 includes the method of example 16, wherein the second component is a memory.

Example 19 includes the method of example 16, wherein the bridge is an active silicon bridge.

Example 20 includes the method of example 16, wherein the bridge is an embedded multi-die interconnect bridge (EMIB).

Example 21 includes the method of any of examples 16-20, wherein the communicative couple includes a metal-insulator-metal (MIM) capacitor.

Example 22 includes the method of any of examples 16-20, wherein the communicative couple includes an optical link.

Example 23 includes the method of example 22, wherein the communicative couple includes a waveguide.

Example 24 includes the method of example 22, wherein the communicative couple includes a first optical transceiver coupled with the bridge and a second optical transceiver at the interposer.

Example 25 includes the method of any of examples 16-20, wherein the interposer further includes a power couple operable to provide power to the second component.

Example 26 includes the method of example 25, wherein the power couple is a non-permanent connection between the interposer and the substrate.

Example 27 includes the method of example 25, wherein the power couple includes a source inductor at the substrate and a receiving inductor at the interposer.

Example 28 includes the method of any of examples 16-20, wherein removably coupling the interposer to the substrate includes coupling the interposer to the substrate by a clamp.

Example 29 includes the method of any of examples 16-20, wherein removably coupling the interposer to the substrate includes positioning the interposer in a socket of the substrate.

Example 30 includes the method of any of examples 16-20, wherein removably coupling the interposer to the substrate includes coupling the interposer to the substrate by a fastener.

Example 31 includes a substrate for use in a system in package (SIP), the substrate comprising: a bridge; a first couple to couple with a first component via a permanent couple such that the first component is communicatively coupled with the bridge; and a second couple to removably couple with an interposer such that the interposer is communicatively coupled with the bridge via a communicative couple.

Example 32 includes the substrate of example 31, wherein the first component is a processor.

Example 33 includes the substrate of example 31, wherein the interposer is coupled with a second component that is a memory.

Example 34 includes the substrate of example 31, wherein the bridge is an active silicon bridge.

Example 35 includes the substrate of example 31, wherein the bridge is an embedded multi-die interconnect bridge (EMIB).

Example 36 includes the substrate of any of examples 31-35, wherein the communicative couple includes a metal-insulator-metal (MIM) capacitor.

Example 37 includes the substrate of any of examples 31-35, wherein the communicative couple includes an optical link.

Example 38 includes the substrate of example 37, wherein the optical link includes a waveguide.

Example 39 includes the substrate of example 37, wherein the optical link includes a first optical transceiver coupled with the bridge and a second optical transceiver at the interposer.

Example 40 includes the substrate of any of examples 31-35, wherein the interposer further includes a power couple operable to provide power to the second component.

Example 41 includes the substrate of example 40, wherein the power couple is a non-permanent connection between the interposer and the substrate.

Example 42 includes the substrate of example 40, wherein the power couple includes a source inductor at the substrate and a receiving inductor at the interposer.

Example 43 includes the substrate of any of examples 31-35, wherein the substrate includes a clamp usable to removably secure the interposer to the substrate by the clamp.

Example 44 includes the substrate of any of examples 31-35, wherein the substrate includes a socket usable to removably secure the interposer to the substrate by the socket.

Example 45 includes the substrate of any of examples 31-35, wherein the interposer is removably secured to the substrate by a fastener.

Example 46 includes the substrate of any of examples 31-35, wherein the permanent couple is a solder bump.

Example 47 includes a package to communicatively couple a processor and a memory, the package comprising: the processor; the memory; an interposer coupled with the memory; and a substrate, wherein the substrate is coupled with the processor, and the substrate is further coupled with the interposer by a non-permanent couple; wherein when the processor and the interposer are coupled with the substrate, the processor and the memory are communicatively coupled with one another by the interposer and the substrate.

Example 48 includes the package of example 47, wherein the substrate is coupled with the processor by a solder microbump.

Example 49 includes the package of example 47, wherein the interposer is coupled with the memory by a solder microbump.

Example 50 includes the package of example 47, wherein the non-permanent couple includes a couple capable of radiative data transfer between the substrate and the interposer.

Example 51 includes the package of example 50, wherein the non-permanent couple includes a metal-insulator-metal (MIM) capacitor.

Example 52 includes the package of example 47, wherein the non-permanent couple includes an optical link.

Example 53 includes the package of example 52, wherein the optical link includes a waveguide.

Example 54 includes the package of example 52, wherein the optical link includes a first optical transceiver coupled with the bridge and a second optical transceiver at the interposer.

Example 55 includes the package of any of examples 47-54, wherein the substrate includes a bridge communicatively positioned between the interposer and the processor.

Example 56 includes the package of example 55, wherein the bridge is an active silicon bridge or an embedded multi-die interconnect bridge (EMIB).

Example 57 includes the package of any of examples 47-54, wherein the non-permanent couple includes a power couple operable to provide power to the memory.

Example 58 includes the package of example 57, wherein the power couple includes a source inductor at the substrate and a receiving inductor at the interposer.

Example 59 includes the package of example 57, wherein the substrate includes a clamp usable to removably secure the interposer to the substrate by the clamp.

Example 60 includes the package of any of examples 47-54, wherein the substrate includes a socket usable to removably secure the interposer to the substrate by the socket.

Example 61 includes the substrate of any of examples 47-54, wherein the interposer is removably secured to the substrate by a fastener.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the present disclosure, including what is described in the Abstract, is not intended to be exhaustive or to limit the present disclosure to the precise forms described herein. While specific implementations of, and examples for, the present disclosure are described herein for illustrative purposes, various equivalent modifications are possible within the scope of the present disclosure, as those skilled in the relevant art will recognize.

These modifications may be made to the present disclosure in light of the above detailed description. The terms used in the following claims should not be construed to limit the present disclosure to the specific implementations disclosed in the specification and the claims. Rather, the scope of the present disclosure is to be determined entirely by the following claims, which are to be construed in accordance with established doctrines of claim interpretation.

The invention claimed is:

1. A system in package (SIP) comprising:
a substrate with a bridge and a first non-permanent communicative element;
a first component coupled with the substrate by a first permanent couple, wherein the first component is communicatively coupled with the bridge;
an interposer with a second non-permanent communicative element and configured to be removably secured to the substrate; and a second component coupled with the interposer by a second permanent couple, wherein, when the interposer is removably secured to the substrate and the second non-permanent communicative element of the interposer is aligned with the first non-permanent communicative element of the substrate to form a non-permanent communicative couple, the first component is communicatively coupled with the second component via the first permanent couple, the non-permanent communicative couple, and the second permanent couple.

2. The SIP of claim 1, wherein the first component is a processor and wherein the second component is a memory.

3. The SIP of claim 1, wherein the bridge is an active silicon bridge or an embedded multi-die interconnect bridge (EMIB).

4. The SIP of claim 1, wherein the non-permanent communicative couple includes a metal-insulator-metal (MIM) capacitor.

5. The SIP of claim 1, wherein the non-permanent communicative couple includes an optical link.

6. The SIP of claim 5, wherein the optical link includes a waveguide.

7. The SIP of claim 5, wherein the optical link includes a first optical transceiver coupled with the bridge and a second optical transceiver at the interposer.

8. The SIP of claim 1, wherein the interposer further includes a power couple operable to provide power to the second component.

9. The SIP of claim 1, wherein the interposer is removably secured to the substrate by a clamp, a socket, or a fastener.

10. A method of generating a system in package (SIP), the method comprising:
   coupling, via a first solder joint, a first component with a substrate, wherein the substrate includes a first communicative element and a bridge, and wherein the first component is communicatively coupled with the bridge of the substrate; and
   removably coupling an interposer to the substrate, wherein the interposer includes a second communicative element;
   forming a non-permanent communicative couple by aligning the second communicative element of the interposer with the first communicative element of the substrate such that the interposer is communicatively coupled with the bridge via the non-permanent communicative couple,
   wherein the interposer is coupled with a second component via a second solder joint and, when the interposer is removably coupled to the substrate and aligned to form the non-permanent communicate couple, the second component is communicatively coupled with the first component via the first permanent couple, the non-permanent communicative couple, and the second permanent couple.

11. The method of claim 10, wherein the first component is a processor and the second component is a memory.

12. The method of claim 10, wherein the bridge is an active silicon bridge or an embedded multi-die interconnect bridge (EMIB).

13. The method of claim 10, wherein the non-permanent communicative couple includes a metal-insulator-metal (MIM) capacitor.

14. The method of claim 10, wherein the non-permanent communicative couple includes an optical link.

15. The method of claim 10, wherein removably coupling the interposer to the substrate includes coupling the interposer to the substrate by a clamp, positioning the interposer in a socket of the substrate, or coupling the interposer to the substrate includes coupling the interposer to the substrate by a fastener.

16. A substrate for use in a system in package (SIP), the substrate comprising:
   a bridge, wherein the bridge includes a first communicative element;
   a permanent couple to couple a first component with the bridge, wherein the first component is communicatively coupled with the bridge via the permanent couple;
   a non-permanent couple to removably couple an interposer with the bridge, wherein the interposer includes a second communicative element, and
   a communicative couple, wherein the interposer is communicatively coupled with the bridge via the communicative couple, and wherein the second communicative element on the interposer aligns with the first communicative element on the bridge to form the communicative couple.

17. The substrate of claim 16, wherein the first component is a processor.

18. The substrate of claim 16, wherein the bridge is an active silicon bridge or an embedded multi-die interconnect bridge (EMIB).

19. The substrate of claim 16, wherein the communicative couple includes a metal-insulator-metal (MIM) capacitor.

20. The substrate of claim 16, wherein the communicative couple includes an optical link.

21. A package to communicatively couple a processor and a memory, the package comprising:
   the processor;
   the memory;
   an interposer coupled with the memory by a first permanent couple, wherein the interposer includes a first communicative element; and
   a substrate, wherein the substrate is coupled with the processor by a second permanent couple, wherein the substrate is further coupled with the interposer by a non-permanent couple, wherein the substrate includes a second communicative element and the second communicative element of the interposer is aligned with the first communicative element of the substrate to form a non-permanent communicative couple, and
   wherein, when the processor and the interposer are coupled with the substrate, the processor and the memory are communicatively coupled with one another by the first permanent couple, the non-permanent communicative couple, and the second permanent couple.

22. The package of claim 21, wherein the second permanent couple includes a solder microbump.

23. The package of claim 21, wherein the first permanent couple includes a solder microbump.

24. The package of claim 21, wherein the non-permanent communicative couple includes a couple capable of radiative data transfer between the substrate and the interposer.

25. The package of claim 21, wherein the non-permanent communicative couple includes an optical link.

* * * * *